(12) United States Patent
Shimizu

(10) Patent No.: US 6,558,996 B1
(45) Date of Patent: May 6, 2003

(54) EDGE STRUCTURE FOR RELAXING ELECTRIC FIELD OF SEMICONDUCTOR DEVICE HAVING AN EMBEDDED TYPE DIFFUSION STRUCTURE

(75) Inventor: Naohiro Shimizu, Nagoya (JP)

(73) Assignee: NGK Insulators, Inc., Nagoya (JP)

( * ) Notice: Subject to any disclaimer, the term of this patent is extended or adjusted under 35 U.S.C. 154(b) by 61 days.

(21) Appl. No.: 09/691,016

(22) Filed: Oct. 18, 2000

(30) Foreign Application Priority Data

Oct. 18, 1999 (JP) ............................................ 11-295032

(51) Int. Cl.⁷ ............................................ H01L 21/337
(52) U.S. Cl. ........................ 438/193; 438/192; 438/195; 438/196
(58) Field of Search ................................ 257/266, 144, 257/268, 147, 263, 265, 490, 494, 495, 496; 438/193, 195, 192, 196

(56) References Cited

U.S. PATENT DOCUMENTS 5,682,044 A * 10/1997 Tamamushi et al. ........ 257/147
6,180,965 B1 * 1/2001 Terasawa .................... 257/144

FOREIGN PATENT DOCUMENTS

| JP | 1-43863 | 12/1989 | |
| JP | 8-186246 | * 7/1996 | ................. 257/144 |

* cited by examiner

Primary Examiner—Steven Loke
(74) Attorney, Agent, or Firm—Burr & Brown

(57) ABSTRACT

Plural $p^+$-type regions are formed on a silicon substrate, and thereafter, an n-type epitaxial growth layer is formed. Narrow concave portions are formed to extend between the surface of the epitaxial growth layer 14 and the silicon substrate and to have the almost the same lateral sectional shape. As a result, remaining parts, which are defined by the concave portions, of the epitaxial growth layer on $p^+$-type field limiting rings are separated from the silicon substrate. Thus, a depletion layer is spread beyond the field limiting rings and a large forward voltage-resistance can be realized.

4 Claims, 12 Drawing Sheets

EDGE STRUCTURE FOR RELAXING ELECTRIC FIELD OF SEMICONDUCTOR DEVICE HAVING AN EMBEDDED TYPE DIFFUSION STRUCTURE

BACKGROUND OF THE INVENTION

1) Field of the Invention

This invention relates to a static induction semiconductor device, particularly, a static induction semiconductor device including a one conduction-type semiconductor substrate, a one conduction-type epitaxial growth layer formed on a surface of the substrate, plural concave portions which extend from a surface of the epitaxial growth layer to the substrate and define plural one main electrode regions composed of the epitaxial growth layer, plural opposite conduction-type gate regions embedded in the respective channel regions between the adjacent concave portions, plural opposite conduction-type guard regions, each being formed under each concave portion, the other main electrode regions formed on the other surface of the semiconductor substrate, and plural opposite conduction-type field limiting rings surrounding the one main electrode regions, the plural channel regions, the plural gate regions and the plural guard regions.

2) Description of the Prior Art

The above-mentioned sort of static induction semiconductor device is known as a buried gate type static induction thyristor, for example. FIGS. 1–5 are cross sectional views showing successive steps to manufacture such a gate type static induction thyristor (SIThy). Herein, the manufacturing steps of one thyristor on a wafer will be described. First of all, as shown in FIG. 1, p-type impurities are implanted into a surface of an i-type (intrinsic) silicon substrate or a n⁻-type silicon substrate 111 at a predetermined energy and dose rate via a given mask, and are driven in to form P⁺-type regions 112 to constitute a guard region and, subsequently, a field limiting ring in a given pattern. Next, p-type impurities are implanted via a given mask, and driven in to form P⁺-type regions 113, which subsequently constitute a gate region. Herein, the junction of the P⁺-type regions 112 is formed deeper than that of the P⁺-type regions 113.

Subsequently, as shown in FIG. 2, an n-type epitaxial growth layer 114 is formed on the silicon substrate 111. In this case, the p-type impurities of the p+type regions 112 and 113 are diffused into the epitaxial growth layer 114. Thereafter, as shown in FIG. 3, an n⁺ type surface layer 114' is formed on the n-type epitaxial growth layer 114 by the conventional diffusion method.

Next, as shown in FIG. 4, the epitaxial growth layer 114 having the n⁺ type surface layer 114' is selectively etched on its surface, and thereby, concave portions 115 is so formed to extend to the P⁺ type regions 112. Channels 116 are composed of the sandwiched portions of the silicon substrate 111 by the adjacent concave portions 115. Then, one main electrode regions, n-type cathode regions 117 in this example, are formed from the sandwiched portions of the epitaxial growth layer 113, and guard regions 118 are composed of the p⁺ type regions 112. Moreover, at the same time of the formation of the concave portions 115, large region concave portions 119 are formed by etching the epitaxial growth layer 114 covering the channels, and thereby, field limiting rings 120, composed of the p⁺ type regions 112, are formed.

Moreover, as shown in FIG. 5, a silicon oxide film 121 is formed on the epitaxial growth layer 114, and the portions of the silicon film 121 above the n-type cathode regions 117 and the p⁺ type guard regions 118 are selectively removed to form cathode electrodes 122 and the gate electrodes 123. And then, on the other surface of the silicon substrate 111 are formed n-type regions 124, n⁺-type regions 125 and p⁺-type regions 126. The p⁺-type regions 126 constitute anode electrode regions as the other main electrode regions, and an anode electrode 127 is formed on the whole back surface of the silicon substrate 111 so as to be connected to the anode electrode regions. At the outside of the field limiting rings 120 are formed channel stop rings 128 having electrodes 129 thereon composed of the n-type epitaxial growth layer 114.

During operation of the SIThy, a direct current power supply is connected between the cathode electrodes 122 and the anode electrode 127, such that a forward main voltage is applied therebetween. If the thyristor is switched-on, positive signals for the gate electrode 123 to cathode electrodes 122 are input into. Just then, a main current is flown from the anode electrode 127 to the cathode electrodes 122 via channels 116. And, if a negative gate bias voltage for the cathode electrodes is applied to the cathode electrodes 122, electric charges are extracted from the gate electrodes 123, and thereby, the depletion region is enlarged from the gate regions 112 and the guard regions 118. As a result, the electric conduction through the channels 116 is shut down and no current is flown between the anode electrode 127 and the cathode electrodes 122. In this off-state, although the main voltage is applied between the anode electrode 127 and the cathode electrodes 122, the thyristor can have a large voltage-resistance because its electric field intensity is mitigated by the guard regions 118 and the field limiting rings 120 in the cathode electrode side.

In the conventional embedded gate type SIThy as mentioned above, the large concave portions 119 to form the regions including the field limiting rings 120 are formed in the forming step of the concave portions 115 which are elongated between the surface of the epitaxial growth layer 114 and the silicon substrate and define unit segments S in the cathode side. The concave portions 115 and 119 are formed by wet-etching using a mixed solution of hydrofluoric acid, nitric acid, acetic acid and so on. However, if the concave portions 119 is formed by the above wet-etching, they tend to have their shallow central portions as shown in FIG. 6. For example, although the concave portion 119 shown in FIG. 6 has a depth D1 of almost 17 μm at both ends, it has a depth D2 of only almost 14 μm at its central portion, which is smaller than the depth D1 by 3 μm.

If the concave portion 119 does not have uniform depth over its whole region, the n-type epitaxial growth layer 114 partially remains at the upper sides of the field limiting rings 120, resulting in the difficulty of the whole spread of a depletion layer 130. That is, if the n-type regions exist on the spreading region of the depletion layer 130, the edge of the depletion layer is unlikely to spread and thus, a current field is concentrated at a smaller region than a predetermined region. As a result, a desired forward blocking voltage ability, that is, high blocking voltage can not be realized in the thyristor.

The cause of the shallow central portion of the concave portion 119 shown in FIG. 6 in the forming step of the field limiting ring 120 using wet-etching will be considered below.

In wet-etching, an etching solution is stirred and an additional etching solution is supplied constantly in order to perform the uniform etching process. In this case, the etching process is hindered if the gases generated in the above etching process are adsorbed on a surface of a material to be etched. In view of the above matter, Japanese registered utility model No. 1,827,697 discloses the technique of supplying the etching solution to the material from above in an oblique direction. If the etching solution is supplied from above in an oblique direction, the active etching reactive solution, including many etching species incorporated in the etching solution, is easily supplied to the edge portions of the concave portion to be formed because the edge portions are adjacent to the non-etched regions. On the other hand, the reaction-ended inactive etching reactive solution tends to stay at the central portion of the concave portion because the etching reaction occurs in the whole region of the central portion. As a result, the periphery of the concave portion is etched deeper than the central portion thereof. It becomes conspicuous when the etching process is carried out for a large region during a longer time by using an etching solution having a large self-catalytic rate controlling. Therefore, in the case of forming the wide concave portion 119 to form the field limiting rings 120, the large depth difference of 3 μm is brought about between the periphery and the central portion of the concave portion, as mentioned above.

Moreover, a SIThy having a diode connected thereto in anti-parallel is proposed. For reducing a loop inductance in such a reverse conduction-type static inductive thyristor as small as possible, Shimizu et al. propose the technique of building the anti-parallel diode in the thyristor as a 4000V grade reverse conductive SI thyristor in the extended abstract, pp. 4–76, 4–77 of the I.E.E. Japan, 1998, for example. That is, in the conventional SI thyristor shown in FIG. 5, the anti-parallel diode is formed via the isolation region surrounding the active region including the channel 116, and the field limiting rings are formed at the outside of the anti-parallel diode.

In such a reverse conduction-type SIThy, the above isolation region have the same structure as that of the field limiting ring, and plural $P^+$-type regions to constitute plural isolation regions are provided concentrically. For forming such an isolation region, a wider concave portion of several mm width is formed as in forming the field limiting ring regions. However, since the concave portion does not have uniform depth wholly, the n-type epitaxial growth layer remains partially at the tops of the plural isolation $P^+$-type regions, so that the depletion layer, which is generated at the time of off-state of the SIThy, is not elongated beyond the isolation regions and the forward blocking voltage is degraded.

SUMMARY OF THE INVENTION

It is an object of the present invention to provide a static induction device having a sufficiently large forward blocking voltage through its enlarged depletion layer over the field limiting ring in order to maintain a large forward blocking voltage between its anode and cathode by removing the above structural inferality of the above conventional buried gate type static induction device.

It is another object of the present invention to provide a reverse conduction static induction semiconductor device having a sufficient large forward blocking voltage through its enlarged depletion layer over an isolation region between an active region and an anti-parallel diode and a field limiting ring region at the time of off-state of the semiconductor device.

It is still another object of the present invention to provide a method for manufacturing a static induction semiconductor device or a reverse conduction-type semiconductor device which have a sufficient forward blocking voltage.

The static induction semiconductor device of the present invention including a one conduction-type semiconductor substrate, a one conduction-type epitaxial growth layer formed on one surface of the semiconductor substrate. Plural concave portions are provided and extend from a surface of the epitaxial growth layer to the substrate and define plural one main electrode regions composed of the epitaxial growth layer, plural opposite conduction-type gate regions embedded in the respective channel regions between the adjacent concave portions, and plural opposite conduction-type guard regions, each being formed under each concave portion. Other main electrode regions are formed on the other surface of the semiconductor substrate. Plural opposite conduction-type field limiting rings are provided surrounding the one main electrode regions, the plural channel regions, the plural gate regions and the plural guard regions. Each of the field limiting rings is formed under a part of the one conduction-type epitaxial growth layer sandwiched by the respective adjacent concave portions extending to the one surface of the semiconductor substrate from the epitaxial growth layer.

A reverse conduction-type static induction type semiconductor device according to the present invention includes a one conduction-type semiconductor substrate having a one conduction-type epitaxial growth layer formed on one surface of the semiconductor substrate. Plural concave portions are provided and extend from a surface of the epitaxial growth layer to the substrate and define plural one main electrode regions composed of the epitaxial growth layer, plural opposite conduction-type gate regions embedded in the respective channel regions between the adjacent concave portions, and plural opposite conduction-type guard regions, each being formed under each concave portion. Other main electrode regions are formed on the other surface of the semiconductor substrate. Plural isolation rings are provided surrounding the one main electrode regions, the plural channel regions, the plural gate regions and the plural guard regions. Each of the isolation rings is composed of an opposite conduction-type region between respective adjacent concave portions extending to the one surface of the semiconductor substrate from the surface of the epitaxial growth layer under the epitaxial growth layer. An anti-parallel diode is provided having an emitter region composed of an opposite conduction-type surface region formed at the one conduction-type semiconductor substrate and at least the epitaxial growth layer. Plural field limiting rings are formed on the outside of the anti-parallel diode, each field limiting ring being composed of an opposite conduction-type region between respective adjacent concave portions extending to the one surface of the semiconductor substrate from the surface of the epitaxial growth layer.

A method for manufacturing a static induction semiconductor device in accordance with the present invention will be discussed below. As explained above, the static induction semiconductor device includes a one conduction-type semiconductor substrate having a one conduction-type epitaxial growth layer formed on one surface of the semiconductor substrate. Plural concave portions are provided and extend from a surface of the epitaxial growth layer to the substrate and define plural one main electrode regions composed of the epitaxial growth layer, plural opposite conduction-type gate regions embedded in the respective channel regions between the adjacent concave portions, and plural opposite conduction-type guard regions, each being formed under each concave portion. Other main electrode regions are formed on the other surface of the semiconductor substrate. Plural opposite conduction-type field limiting rings are provided surrounding the one main electrode regions, the plural channel regions, the plural gate regions and the plural guard regions, each field limiting ring being formed under a part of the one conduction-type epitaxial growth layer sandwiched by the respective adjacent concave portions extending to the one surface of the semiconductor substrate from the epitaxial growth layer.

The manufacturing method includes the following steps. Opposite conduction-type regions are formed to constitute the guard regions and the field limiting rings selectively at the one surface of the one conduction-type semiconductor substrate. Opposite conduction-type regions are formed to constitute the gate regions selectively at the one surface of the one conduction-type semiconductor substrate. The one conduction-type epitaxial growth layer is formed on the one surface of the semiconductor substrate. The concave portions, which define the channel regions and the field limiting rings, are formed so as to be extended to the one surface of the semiconductor substrate from the epitaxial growth layer. Electrodes are formed for the guard regions at the bottoms of the concave portions to define the channel regions, and electrodes are formed for the one main electrode regions formed above the channel regions and the other main electrode regions formed on the other surface of the semiconductor substrate.

A method for manufacturing a reverse conduction static induction semiconductor device according to the present invention will be described below. As explained above, the reverse conduction static induction semiconductor device includes a one conduction-type semiconductor substrate having a one conduction-type epitaxial growth layer formed on one surface of the semiconductor substrate. Plural concave portions are formed to extend from a surface of the epitaxial growth layer to the substrate and define plural one main electrode regions composed of the epitaxial growth layer, plural opposite conduction-type gate regions embedded in the respective channel regions between the adjacent concave portions, and plural opposite conduction-type guard regions, each being formed under each concave portion. Other main electrode regions are formed on the other surface of the semiconductor substrate. Plural isolation rings are formed surrounding the one main electrode regions, the plural channel regions, the plural gate regions and the plural guard regions, each isolation ring being composed of an opposite conduction-type region between respective adjacent concave portions extending to the one surface of the semiconductor substrate from the surface of the epitaxial growth layer under the epitaxial growth layer. An anti-parallel diode is provided having an emitter region composed of an opposite conduction-type surface region formed at the one conduction-type semiconductor and at least the epitaxial growth layer, and plural field limiting rings formed at the outside of the anti-parallel diode, each field limiting ring being composed of an opposite conduction-type region between respective adjacent concave portions extending to the one surface of the semiconductor substrate from the surface of the epitaxial growth layer.

The method includes the following steps. Opposite conduction-type regions are formed to constitute the guard regions, the isolation rings and the field limiting rings selectively at the one surface of the one conduction-type semiconductor substrate. Opposite conduction-type regions are formed to constitute the gate regions and the emitter region of the anti-parallel diode selectively at the one surface of the one conduction-type semiconductor substrate.

The one conduction-type epitaxial growth layer is formed on the one surface of the semiconductor substrate. The concave portions are formed to define the channel regions, the isolation rings and the field limiting rings so as to be extended to the one surface of the semiconductor substrate from the epitaxial growth layer. An opposite conduction-type surface region is formed to constitute the emitter region of the anti-parallel diode in the epitaxial growth layer. Electrodes are formed for the guard regions at the bottoms of the concave portions to define the channel regions, and electrodes are formed for opposite conduction-type surface regions to constitute the one main electrode regions formed above the channel regions, the other main electrode regions formed on the other surface of the semiconductor substrate and the emitter region of the anti-parallel diode.

In the above static induction semiconductor device and the manufacturing method according to the present invention, it is desired that the concave portions to define the field limiting rings and, in some cases, the isolation rings have almost the same size as that of the concave portions to define the channels. Thereby, the etching process can be performed uniformly for all the concave portions and thus, the fluctuation in the depths of the concave portions can be repressed. For example, in the case of forming plural ditches having almost 40–60 $\mu$m widths and 15 $\mu$m depth at the same wafer by etching, it is confirmed that the fluctuation in the etched depths is within 1 $\mu$m.

Moreover, in the present invention, it is desired that the reverse conduction-type guard regions, the reverse conduction-type field limiting rings and, in some cases, the isolation rings are joined by the same junction depth which is larger than the depths of the reverse conduction-type gate regions. Thereby, the depletion layer is absolutely elongated to the lower side of the guard regions, the field limiting rings and the isolation rings, and the local concentration of the electric field can be mitigated, so that the forward voltage-resistance can be more enhanced.

BRIEF DESCRIPTION OF THE DRAWINGS

For a better understanding of the invention, reference is made to the accompanying drawings, in which.

DETAILED DESCRIPTION OF THE INVENTION

The invention will be described in detail below, with reference to the above drawings.

Figure 1:
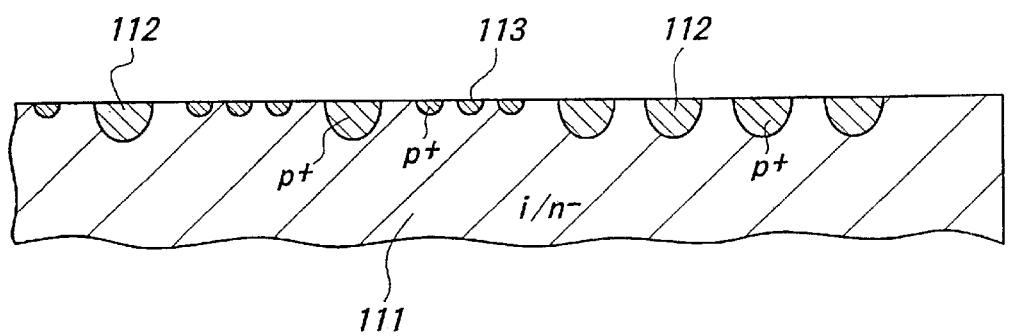
FIG. 1 is a cross sectional view showing a manufacturing step of a conventional static induction thyristor.
Figure 2:
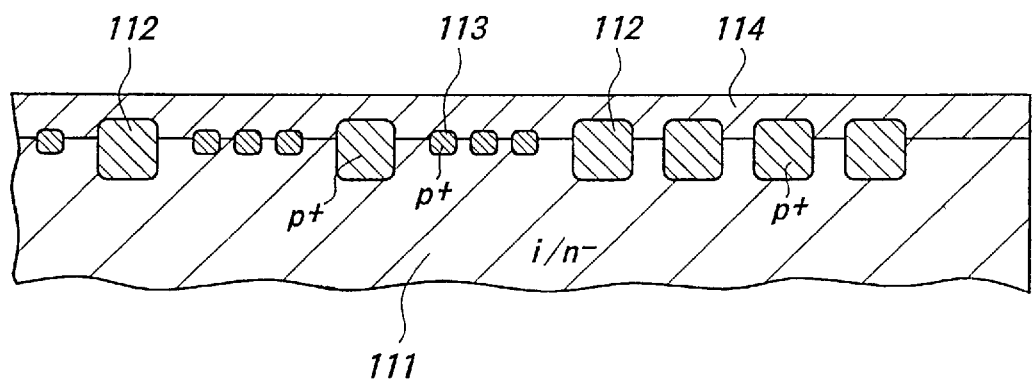
FIG. 2 is a cross sectional view showing a step subsequent to the step shown in FIG. 1.
Figure 3:
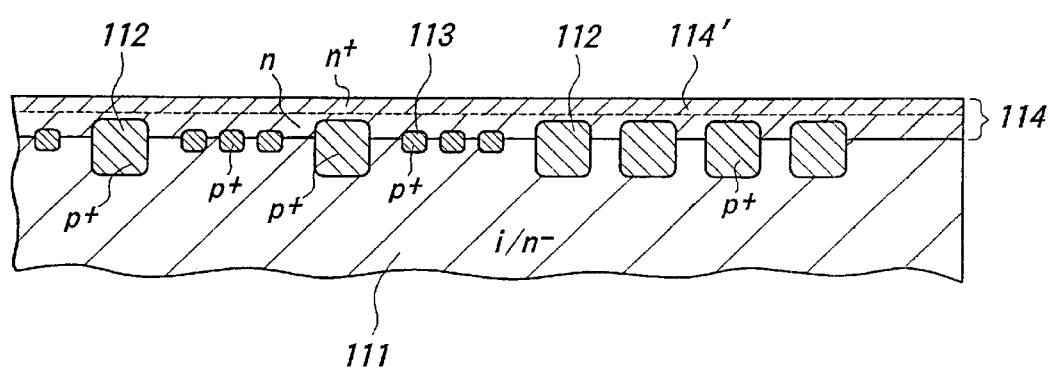
FIG. 3 is a cross sectional view showing a step subsequent to the step shown in FIG. 2.
Figure 4:
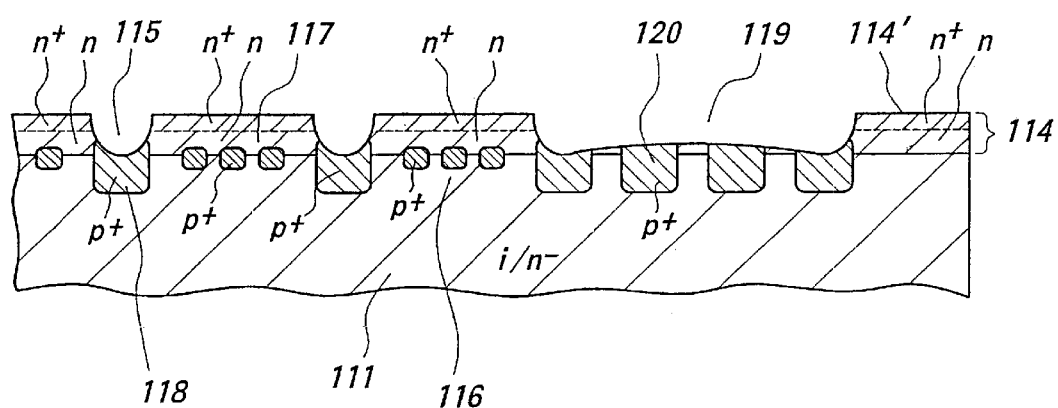
FIG. 4 is a cross sectional view showing a step subsequent to the step shown in FIG. 3.
Figure 5:
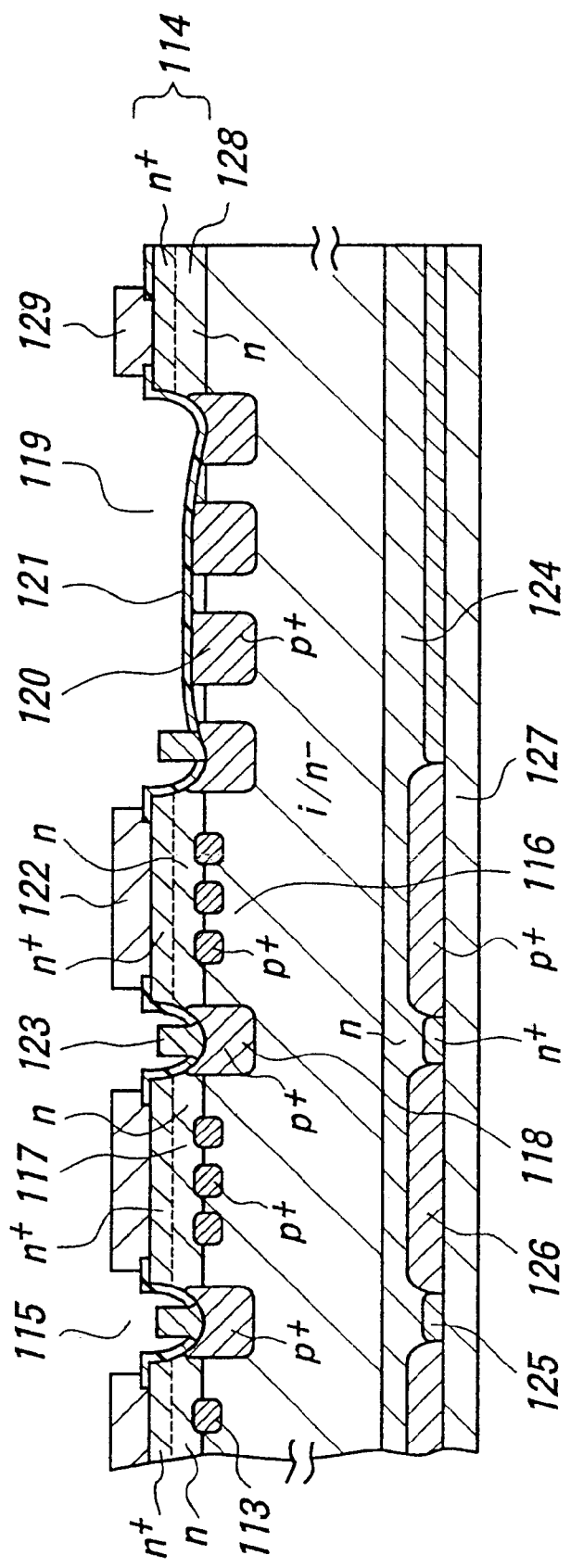
FIG. 5 is a cross sectional view showing a step subsequent to the step shown in FIG. 4.
Figure 6:
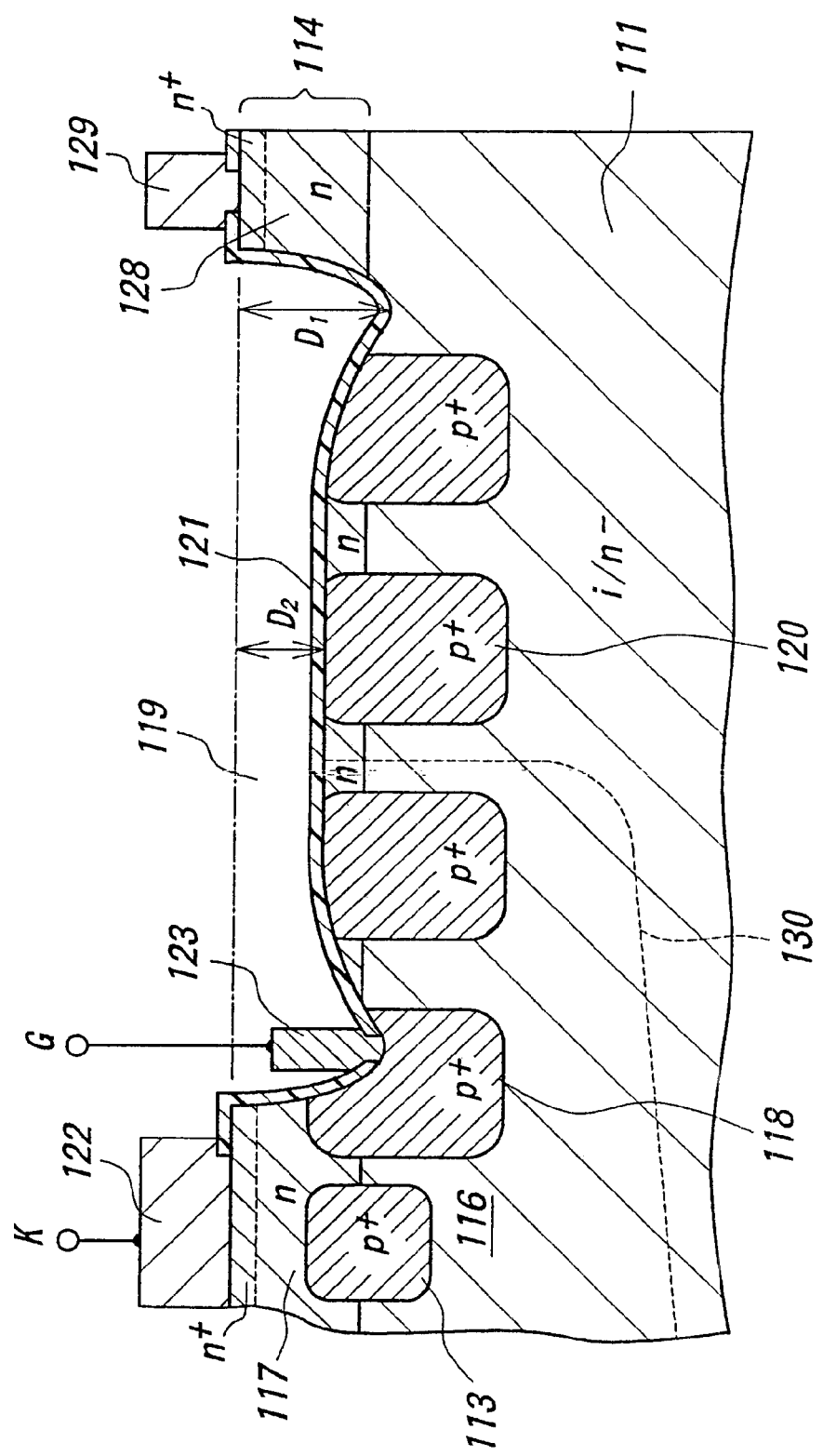
FIG. 6 is a cross sectional view showing in enlargement a field limiting region of the conventional static induction thyristor.
Figure 7:
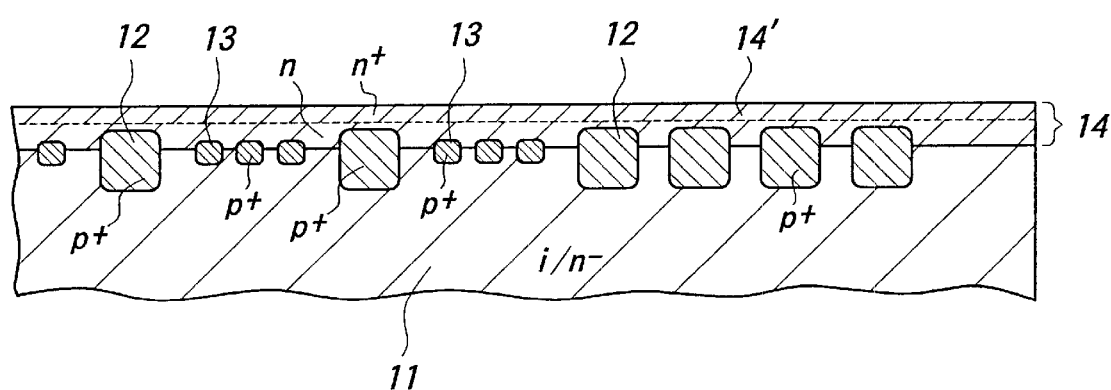
FIG. 7 is a cross sectional view showing a manufacturing step of a static induction thyristor according to the present invention.
Figure 8:
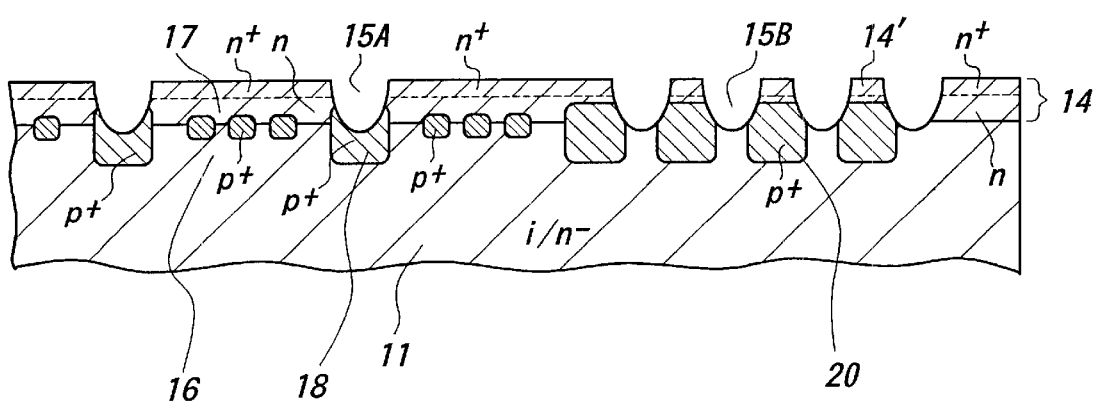
FIG. 8 is a cross sectional view showing a step subsequent to the step shown in FIG. 7.
Figure 9:
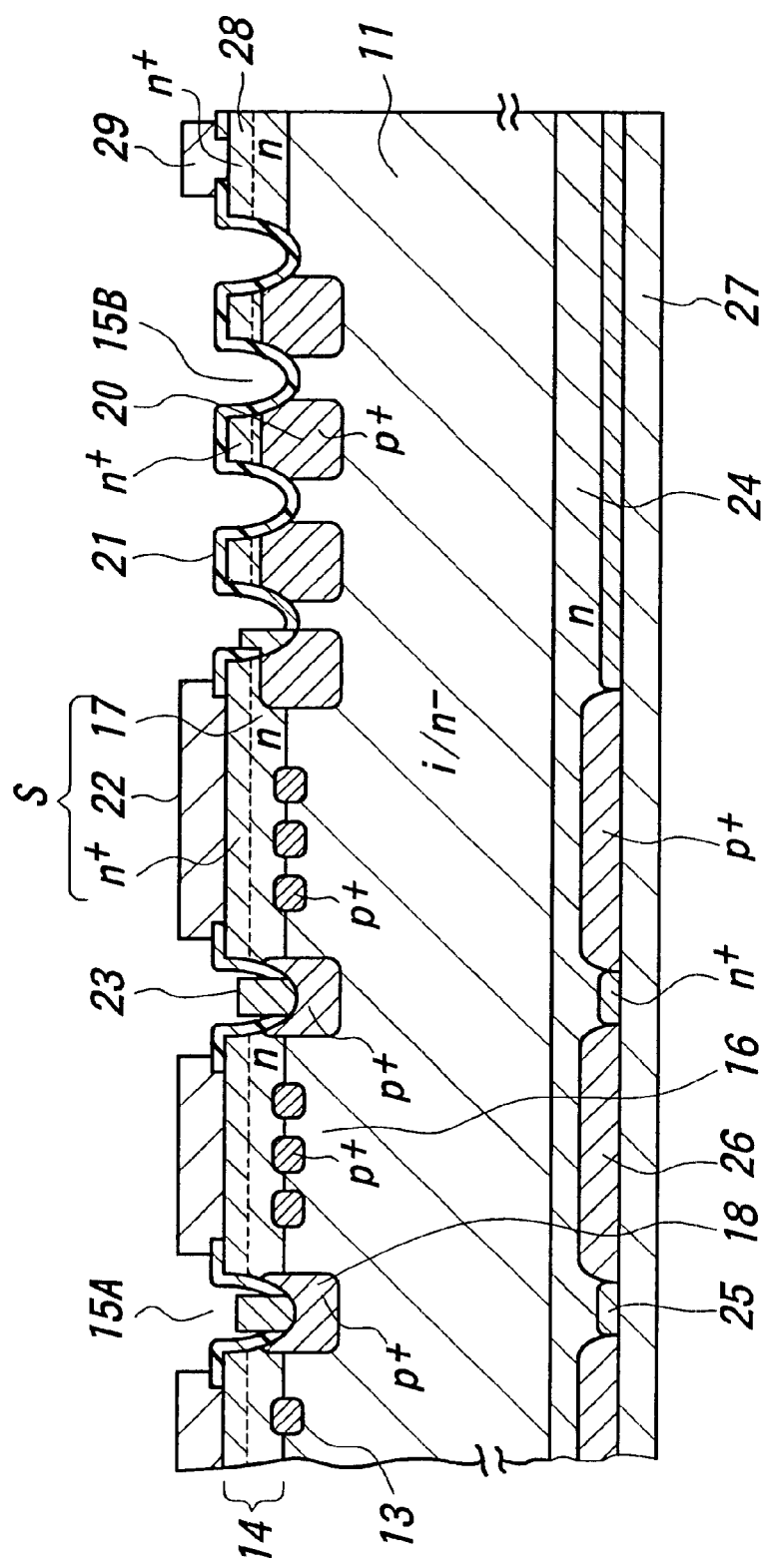
FIG. 9 is a cross sectional view showing a step subsequent to the step shown in FIG. 8.

FIGS. 7–9 are cross sectional views showing successive manufacturing steps in a first embodiment of the static induction thyristor according to the present invention. Herein, the successive manufacturing steps of one thyristor on a wafer will be described. The manufacturing step shown in FIG. 7 is similar to the conventional one shown in FIG. 3, in which $P^+$-type regions 12 to constitute guard regions and field limiting rings and $P^+$-type regions 13 to constitute gate regions are formed on an intrinsic (i) or an n-type silicon substrate 11, and thereafter, an $n^-$-type silicon epitaxial growth layer 14 is formed. Thereafter, an $n^+$-type diffusion layer 14' is formed by a well known diffusion method.

Next, as shown in FIG. 8, concave portions 15A and 15B are formed at the positions corresponding to the guard regions and the field limiting rings by wet-etching so as to be extended to the silicon substrate 11 from the surface of the epitaxial growth layer 14. In this invention, the narrow concave portions 15B are formed so as to correspond to the respective field limiting rings, so a conventional wide concave portion to cover some of plural field limiting rings is not formed. In this case, it is desired that the concave portions 15B have the almost same width as that of the concave portions 15A corresponding to the guard regions. As a result, the concave portions 15A and 15B have the almost same lateral sectional shape, and the spread of the depletion layer is not likely to be disturbed, so that a desired forward voltage-resistance can be realized.

The concave portions 15A enable cathode side unit segments S composed of channels 16 and $n^+$-type cathode regions 17 to be formed between the adjacent concave portions 15A, and enable $P^+$-type guard regions 18 to be formed under each of the concave portions 15A. The concave portions 15B enables $p^+$-type field limiting rings 20 to be formed between the adjacent concave portions 15B.

The subsequent manufacturing steps are similar to the above conventional ones. As shown in FIG. 9, a silicon oxide film 21 is formed on the epitaxial growth layer 14 and the inner surfaces of the concave portions 15A and 15B, and is selectively removed to form openings, so that cathode electrodes 22 and gate electrodes 23 are formed. Moreover, on the back surface of the silicon substrate 11 are formed an n-type region 24, $n^+$-type regions 25, $p^+$-type regions 26 and an anode electrode 27.

Figure 10:
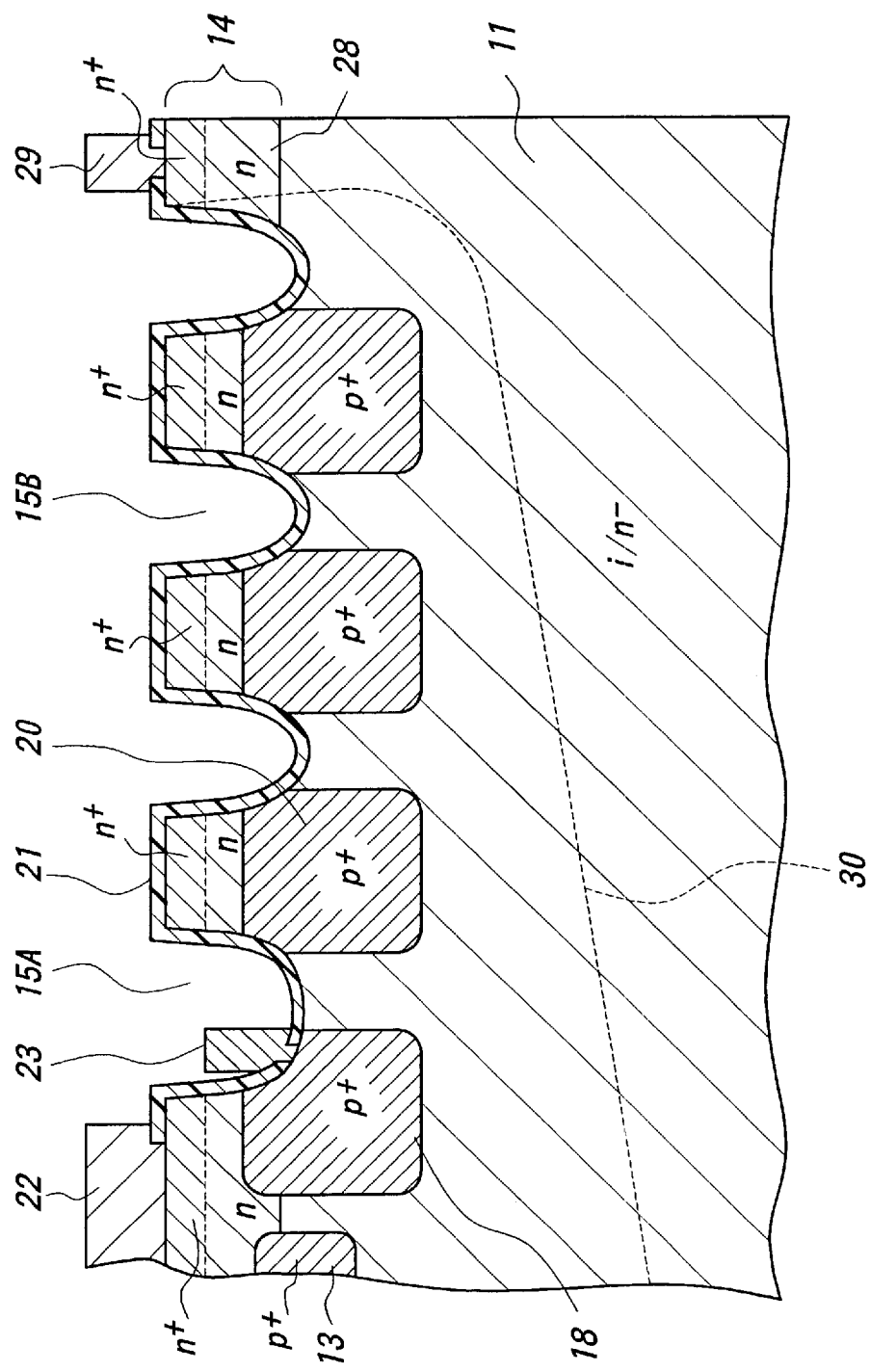
FIG. 10 is a cross sectional view showing in enlargement a field limiting ring of the static induction thyristor of the present invention.
Figure 11:
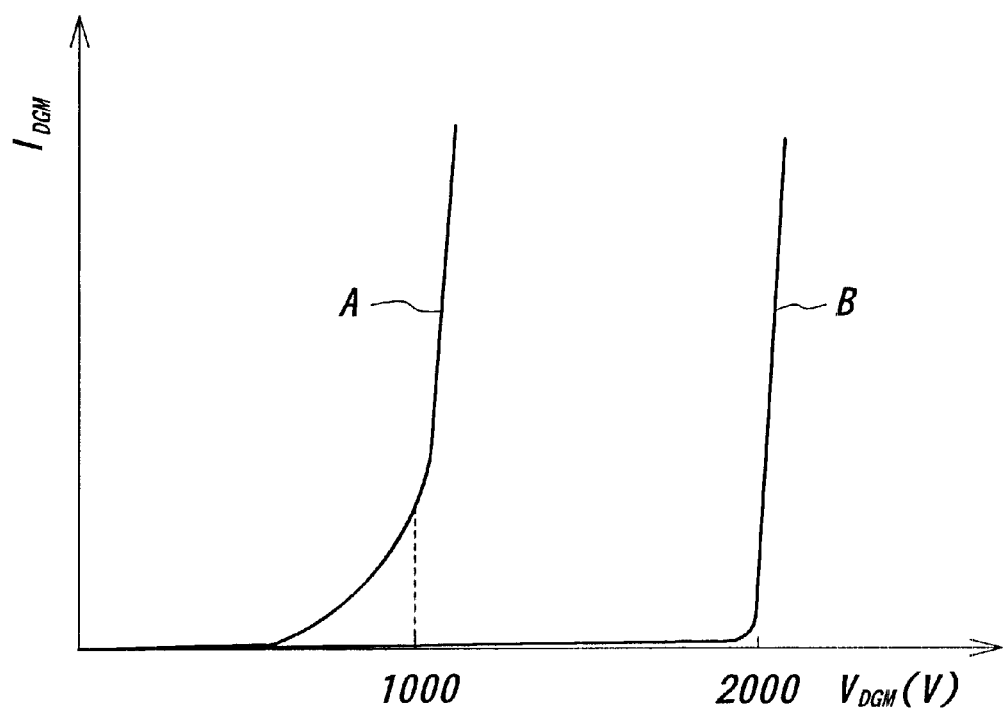
FIG. 11 is a graph showing forward voltage-resistances of a conventional thyristor and the thyristor according to the present invention.

FIG. 10 is an enlarged cross sectional view of the field limiting ring region. In this invention, although each field limiting ring 20 is defined by the concave portions 15B, the n-type epitaxial growth layer 14 does not partially remain inside the concave portions because each concave portion 15B is narrower than the conventional concave portion. In this case, although the n-type epitaxial layer partially remains on each field limiting ring 20, the depletion layer, which is generated at the off-state of the thyristor, is elongated beyond the field limiting rings 20 because the remaining parts of the epitaxial layer are separated from the silicon substrate 11, so that a sufficient large forward blocking voltage can be realized. When the static induction thyristor according to the present invention has the same designed forward blocking voltage value of 2000 V and the same size and characteristics as the ones of the above conventional one, the SIThy of the present invention shown in FIG. 10 can have the designed forward blocking voltage value as depicted by the curve B in FIG. 11. On the other hand, the conventional SIThy can have an only forward blocking voltage value of 1200V much smaller than the above designed value as depicted by the curve A in FIG. 11. Moreover, it is also confirmed that a leak current does not occur nearly up to 2000V in the thyristor of the present invention although a leak current occurs over 500V in the conventional thyristor.

Figure 12:
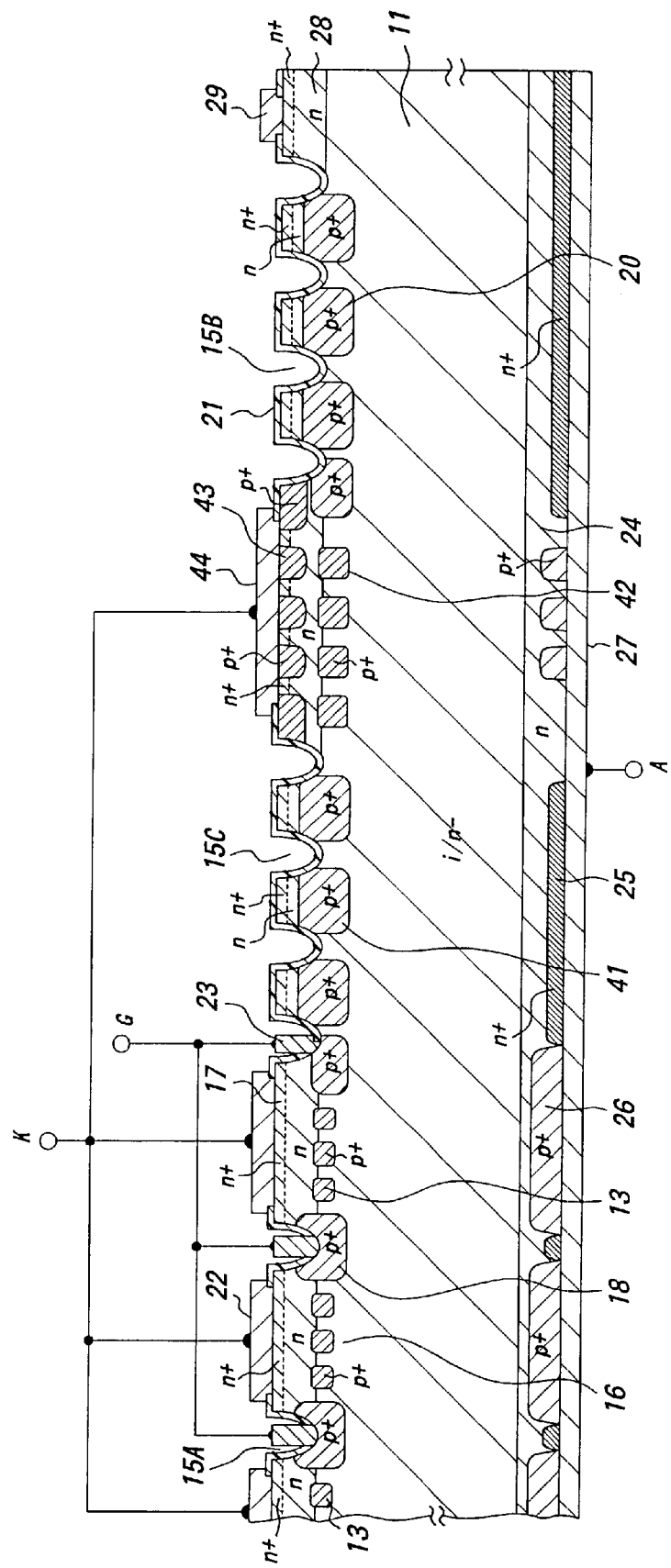
FIG. 12 is a cross sectional view showing a reverse conduction static induction thyristor according to the present invention.

FIG. 12 shows a second embodiment of the SIThy of the present invention. In this embodiment, Reverse Conduction Static Induction Thyristor (RC-SIThy) having anti-parallel diodes is presented. In this reverse conduction-type SIThy, plural $p^+$-type isolation rings 41 are formed so as to surround the active regions including the channels 16, and a diode are formed at the outside of the isolation rings. The diode has plural $p^+$-type embedded regions 42 which are formed with the $p^+$-type gate regions 13 and embedded in the channel 16, plural $p^+$-type surface regions 43 formed on the epitaxial growth layer 14 and an anode electrode 44 connected to the plural surface regions. The anode electrode 44 is connected to the cathode electrode 22.

The plural $p^+$-type field limiting rings 20 are formed at the outside of the anti-parallel diodes, and a channel limit ring 28 and an electrode 29 connected to the ring 28 are formed at the outside of the plural field limiting rings 20. The electrode 29 is held at a floating electric potential.

In this embodiment, the plural isolation rings 41 to constitute the isolation regions surrounding the active regions are defined by concave portions 15C having the same width and pitch as the ones of the concave portions 15A in the main device of the thyristor. Active etching species are supplied uniformly to the concave portions and etching-ended inactive etching species remain uniformly in the concave portions, so that all the concave portions are uniformly etched. Therefore, the epitaxial growth layer 14 does not almost remain in the concave portions between the adjacent isolation rings. In this case, the depletion layer is elongated under the field limiting rings 20 via the lower side of the isolation rings 41 when a given voltage is applied between the main electrodes at the off-state of the SIThy, and thus, a sufficient large forward blocking voltage can be realized as designed. In this embodiment, it is desired that the concave portions 15c to define the isolation rings 41 have the almost same lateral sectional shape as that of the concave portions 15A to define the guard regions 18 and the concave portions 15B to defined the field limiting rings 20.

This invention has been described in detail with reference to the above preferred concrete embodiments, but it is obvious for the ordinary person skilled in the art that various modifications can be made in its configuration and detail without departing from the scope of this invention. For example, the field limiting rings and the isolation rings may be set to any number not less than two. Moreover, the static induction device and the manufacturing method of the present invention can be applied for the above SIThy and RC-SIThy, but may be applied for a Static Induction Transistor (SIT).

As mentioned above, since in the present invention, the field limiting rings and the isolation rings are defined by the narrow concave portions, the etching process can be performed uniformly for the concave portions. As a result, the epitaxial growth layer does not partially remain in the concave portions and thus, the depletion layer can spread beyond the field limiting rings and the isolation rings, so that the forward blocking voltage can be sufficiently enhanced at off-state and the reliability of the static induction device can be developed.

Moreover, if the concave portions to define the field limiting rings and the isolation rings have the almost same lateral sectional shape as that of the concave portions to define the channels, all the concave portions can have the planer uniform distribution and thus, the operation performance of the main device can be more improved.

What is claimed is:

1. A method for manufacturing a static induction semiconductor device having a one conduction-type semiconductor substrate, a one conduction-type epitaxial growth layer formed on a first surface of the semiconductor substrate, plural concave portions which extend from a surface of the epitaxial growth layer to the first surface of said semiconductor substrate and define plural first main electrode regions composed of the epitaxial growth layer, plural opposite conduction-type gate regions embedded in respective channel regions between adjacent concave portions, plural opposite conduction-type guard regions, each being formed under each concave portion, second main electrode regions being formed on a second surface of the semiconductor substrate, and plural opposite conduction-type field limiting rings surrounding the first main electrode regions, plural channel regions, the plural gate regions and the plural guard regions, each field limiting ring being formed under a part of the one conduction-type epitaxial growth layer sandwiched by the respective adjacent concave portions extending to the first surface of the semiconductor substrate from the epitaxial growth layer, comprising the steps of:

forming opposite conduction-type regions to constitute the guard regions and the field limiting rings selectively at the first surface of the one conduction-type semiconductor substrate;

forming opposite conduction-type regions to constitute the gate regions selectively at the first surface of the one conduction-type semiconductor substrate;

forming the one conduction-type epitaxial growth layer on the first surface of the semiconductor substrate;

forming the concave portions to define the channel regions and the field limiting rings, said concave portions extending to the first surface of the semiconductor substrate from the epitaxial growth layer;

forming electrodes for the guard regions at the bottoms of the concave portions to define the channel regions; and forming electrodes for the first main electrode regions formed above the channel regions and the second main electrode regions formed on the second surface of the semiconductor substrate.

2. A method for manufacturing a static induction semiconductor device as defined in claim 1, wherein the concave portions which define the field limiting rings and the concave portions which define the channel regions are formed to have substantially the same lateral sectional size.

3. A method for manufacturing a reverse conduction static induction semiconductor device comprising a one conduction-type semiconductor substrate, a one conduction-type epitaxial growth layer formed on a first surface of the semiconductor substrate, plural concave portions which extend from a surface of the epitaxial growth layer to the first surface of said semiconductor substrate and define plural first main electrode regions composed of the epitaxial growth layer, plural opposite conduction-type gate regions embedded in respective channel regions between adjacent concave portions, plural opposite conduction-type guard regions, each being formed under each concave portion, second main electrode regions being formed on a second surface of the semiconductor substrate, plural isolation rings surrounding the first main electrode regions, the plural channel regions, the plural gate regions and the plural guard regions, each isolation ring being composed of an opposite conduction-type region between respective adjacent concave portions extending to the first surface of the semiconductor substrate from a lower surface of the epitaxial growth layer, an anti-parallel diode having an emitter region composed of an opposite conduction-type surface region formed on the one conduction-type semiconductor substrate and at least the epitaxial growth layer, and plural field limiting rings formed at the outside of the anti-parallel diode, each field limiting ring being composed of an opposite conduction-type region between respective adjacent concave portions extending to the first surface of the semiconductor substrate from the surface of the epitaxial growth layer, comprising the steps of:

forming opposite conduction-type regions to constitute the guard regions, the isolation rings and the field limiting rings selectively on the first surface of the one conduction-type semiconductor substrate;

forming opposite conduction-type regions to constitute the gate regions and the emitter region of the anti-parallel diode selectively on the first surface of the one conduction-type semiconductor substrate;

forming the one conduction-type epitaxial growth layer on the first surface of the semiconductor substrate;

forming the concave portions to define the channel regions, the isolation rings and the field limiting rings, said concave portions extending to the first surface of the semiconductor substrate from the epitaxial growth layer;

forming an opposite conduction-type surface region to constitute the emitter region of the anti-parallel diode in the epitaxial growth layer;

forming electrodes for the guard regions at the bottoms of the concave portions to define the channel regions; and forming electrodes for the first main electrode regions formed above the channel regions, the second main electrode regions formed on the second surface of the semiconductor substrate and the emitter region of the anti-parallel diode.

4. A method for manufacturing a reverse conduction static induction semiconductor device as defined in claim 3, wherein the concave portions which define the channel regions, the isolation rings and the field limiting rings are formed to have substantially the same lateral sectional size.

* * * * *